US008847471B2

(12) United States Patent
Hahiro

(10) Patent No.: US 8,847,471 B2
(45) Date of Patent: Sep. 30, 2014

(54) PIEZOELECTRIC ELEMENT, PIEZOELECTRIC ACTUATOR, LIQUID EJECTING HEAD, AND LIQUID EJECTING APPARATUS

(75) Inventor: Hideki Hahiro, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 421 days.

(21) Appl. No.: 13/227,349

(22) Filed: Sep. 7, 2011

(65) Prior Publication Data

US 2012/0062074 A1 Mar. 15, 2012

(30) Foreign Application Priority Data

Sep. 9, 2010 (JP) ................. 2010-201663

(51) Int. Cl.
*H01L 41/047* (2006.01)
*H01L 41/09* (2006.01)
*B41J 2/16* (2006.01)
*B41J 2/14* (2006.01)
*H01L 41/08* (2006.01)
*H01L 41/332* (2013.01)
*H01L 41/053* (2006.01)

(52) U.S. Cl.
CPC ........... *H01L 41/0478* (2013.01); *B41J 2/1634* (2013.01); *B41J 2/1628* (2013.01); *B41J 2/1631* (2013.01); *B41J 2/1642* (2013.01); *B41J 2/14233* (2013.01); *B41J 2/1646* (2013.01); *H01L 41/0805* (2013.01); *H01L 41/332* (2013.01); *H01L 41/0533* (2013.01); *B41J 2/161* (2013.01)
USPC ............ 310/363; 310/340; 310/364; 310/365

(58) Field of Classification Search
USPC .......................................... 310/340, 363–366
See application file for complete search history.

(56) References Cited

U.S. PATENT DOCUMENTS

| 3,573,511 | A | * | 4/1971 | Noren ........................... 310/364 |
| 6,089,701 | A | | 7/2000 | Hashizume et al. |
| 6,252,337 | B1 | * | 6/2001 | Tanaka .......................... 310/364 |
| 6,476,540 | B2 | * | 11/2002 | Takeuchi et al. .............. 310/331 |
| 8,093,962 | B2 | * | 1/2012 | Taniguchi et al. ............. 333/133 |
| 2002/0149298 | A1 | * | 10/2002 | Furukawa et al. ............. 310/340 |
| 2006/0125879 | A1 | | 6/2006 | Fujii et al. |
| 2007/0188976 | A1 | | 8/2007 | Nakayama |
| 2007/0284967 | A1 | | 12/2007 | Shimada et al. |
| 2008/0284543 | A1 | * | 11/2008 | Taniguchi et al. ............. 333/187 |

(Continued)

FOREIGN PATENT DOCUMENTS

| JP | 10-226071 A | 8/1998 |
| JP | 2002-151484 A | 5/2002 |

(Continued)

*Primary Examiner* — Thomas Dougherty
(74) *Attorney, Agent, or Firm* — Kilpatrick Townsend & Stockton LLP

(57) ABSTRACT

A piezoelectric element includes a first electrode, a first multilayer composite disposed on the first electrode, a second multilayer composite disposed on the first electrode with a distance from the first multilayer composite, and a covering layer covering the side surfaces of the first and second multilayer composites and the surface of the first electrode between the first multilayer composite and the second multilayer composite. The first and second multilayer composites each include a piezoelectric layer and a second electrode over the piezoelectric layer. The first electrode contains a metal that can react with chlorine, and has at least one of a bump and a dip at the surface thereof between the first multilayer composite and the second multilayer composite.

19 Claims, 11 Drawing Sheets

(56) References Cited

U.S. PATENT DOCUMENTS

2009/0160914 A1* 6/2009 Fujii ................................ 347/68
2010/0079558 A1* 4/2010 Shimada ......................... 347/71
2011/0266690 A1* 11/2011 Ito et al. ......................... 257/773
2012/0049976 A1* 3/2012 Son et al. ....................... 333/133
2012/0056945 A1* 3/2012 Nakayama ..................... 347/68

FOREIGN PATENT DOCUMENTS

| JP | 2006-271183 A | 10/2006 |
| JP | 2007-227753 A | 9/2007 |
| JP | 2007-329285 A | 12/2007 |
| JP | 2008-270630 A | 11/2008 |

* cited by examiner

PIEZOELECTRIC ELEMENT, PIEZOELECTRIC ACTUATOR, LIQUID EJECTING HEAD, AND LIQUID EJECTING APPARATUS

This application claims a priority to Japanese Patent Application No. 2010-201663 filed on Sep. 9, 2010 which is hereby expressly incorporated by reference herein in its entirety.

BACKGROUND

1. Technical Field

The present invention relates to a piezoelectric element, a piezoelectric actuator, a liquid ejecting head, and a liquid ejecting apparatus.

2. Related Art

Piezoelectric elements are deformed according to the voltage applied thereto, and have a structure in which a piezoelectric layer is disposed between electrodes. Piezoelectric elements are used in liquid ejecting heads of ink jet printers, and other various devices such as actuators.

The piezoelectric layer of the piezoelectric element is susceptible to degradation by moisture or the like. In order to prevent the degradation of the piezoelectric layer caused by moisture from the atmosphere, for example, the ink jet recording head disclosed in JP-A-10-226071 is provided with a protective film over the side surfaces of the piezoelectric layer and the upper surface of the lower electrode.

In order to enhance the reliability of the piezoelectric element having such a structure, it is important to enhance the adhesion between the protective film and each of the piezoelectric layer and the lower electrode. If the adhesion between the protective film and the piezoelectric layer or the lower electrode is insufficient, the piezoelectric layer may absorb moisture and thus be degraded. Also, when a voltage is applied to drive the piezoelectric element, a leakage current may flow in the gap between the protective film and the piezoelectric layer, thus short-circuiting the upper electrode and the lower electrode. If the adhesion between the protective film and the piezoelectric layer or the lower electrode is insufficient, the reliability of the piezoelectric element may be degraded, as above.

SUMMARY

An advantage of some aspects of the invention is that it provides a highly reliable piezoelectric element. Also, another advantage of the invention is that it provides a piezoelectric actuator, a liquid ejecting head and a liquid ejecting apparatus each including the piezoelectric element.

A piezoelectric element according to an embodiment of the invention includes a first electrode containing a metal that can react with chlorine, a first multilayer composite disposed on the first electrode, a second multilayer composite disposed on the first electrode with a distance from the first multilayer composite, and a covering layer covering the side surfaces of the first and second multilayer composites and the surface of the first electrode between the first multilayer composite and the second multilayer composite. The first multilayer composite and the second multilayer composite each include a piezoelectric layer and a second electrode over the piezoelectric layer. The first electrode has at least one of a bump and a dip at the surface thereof between the first multilayer composite and the second multilayer composite.

In this piezoelectric element, at least either a bump or a dip is formed at the surface of the first electrode between the first and second multilayer composites. Consequently, the contact area of the first electrode with the covering layer or protective film is increased relative to the case where the bump or dip is not formed. Accordingly, the adhesion between the covering layer and the first electrode is increased to ensure high reliability.

In the description, expressions using the preposition "on", for example, "A is disposed on B", means that A lies on B directly or with something therebetween.

The first electrode may have a single-layer structure including a layer containing lanthanum and nickel, or a multilayer structure including in this order from below a layer containing platinum or iridium and a layer containing lanthanum and nickel.

In this instance, the first electrode contains a substance that can react with chlorine. Therefore, the bump or dip can be easily formed by using a chlorine-based gas, and thus the manufacturing process can be simplified.

A plurality of bumps may be formed on the surface of the first electrode, and the number of the bumps per unit area gradually increases toward the first multilayer composite and the second multilayer composite.

This structure can enhance the adhesion between the covering layer and the first electrode around the first multilayer composite and the second multilayer composite.

The bump may have a cavity, and part of the covering layer is present in the cavity.

This structure can further enhance the adhesion between the covering layer and the first electrode.

A plurality of dips may be formed in the surface of the first electrode, and the number of the bumps per unit area gradually increases toward the first multilayer composite and the second multilayer composite.

This structure can enhance the adhesion between the covering layer and the first electrode around the first multilayer composite and the second multilayer composite.

The bumps may contain lanthanum, nickel and chlorine.

A piezoelectric actuator according to another embodiment of the invention includes the piezoelectric element.

Since the piezoelectric actuator includes the piezoelectric element describe above, the actuator can exhibit high reliability.

A liquid ejecting head according to an embodiment of the invention includes the piezoelectric actuator.

Since the liquid ejecting head includes the piezoelectric actuator, the head can exhibit high reliability.

A liquid ejecting apparatus according to an embodiment of the invention includes the liquid ejecting head.

Since the liquid ejecting apparatus includes the liquid ejecting head, the apparatus can exhibit high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Preferred embodiments of the invention will now be described with reference to the drawings.

1. Piezoelectric Element

Figure 1:
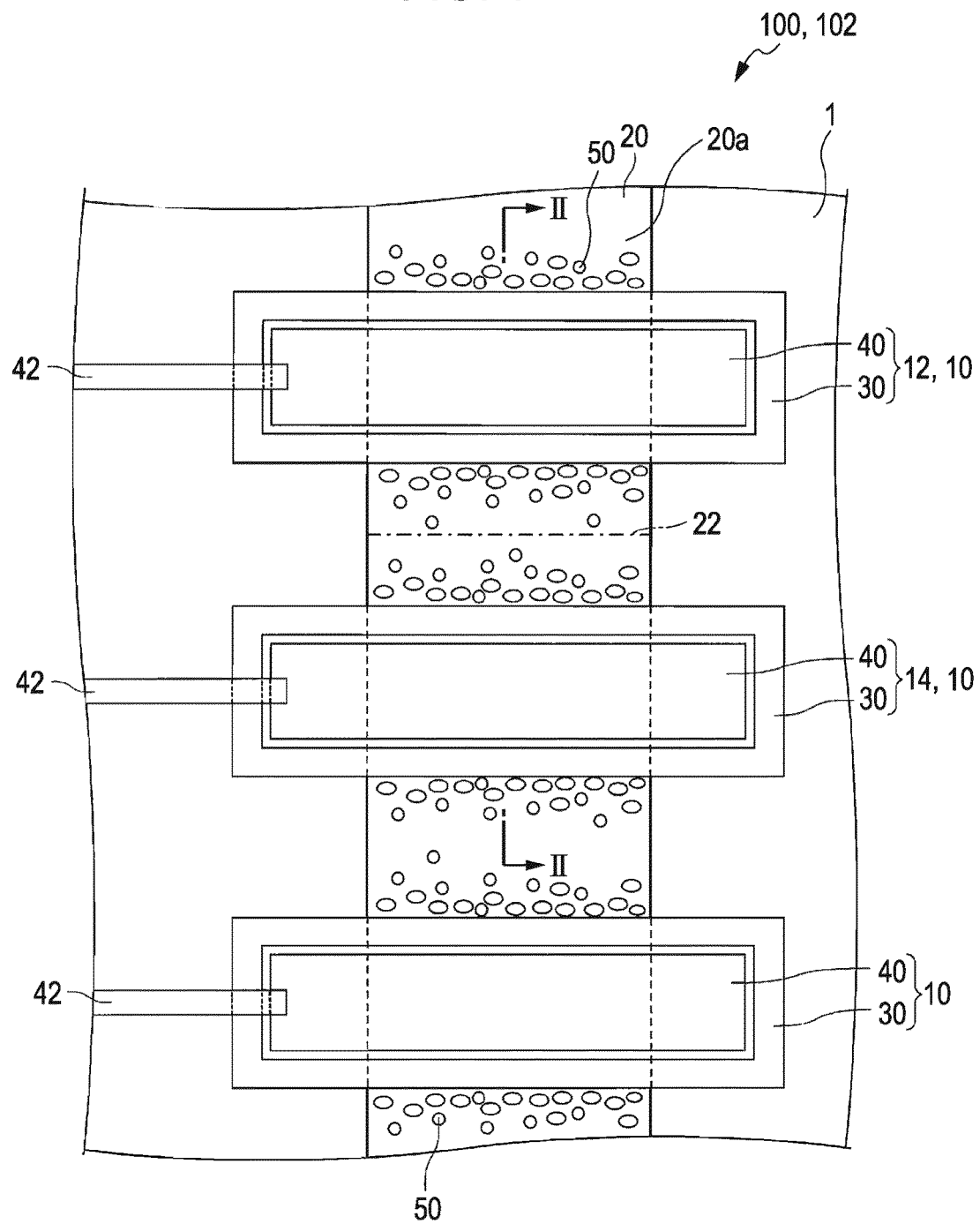
FIG. 1 is a schematic plan view of a piezoelectric element according to an embodiment of the invention.
Figure 2:
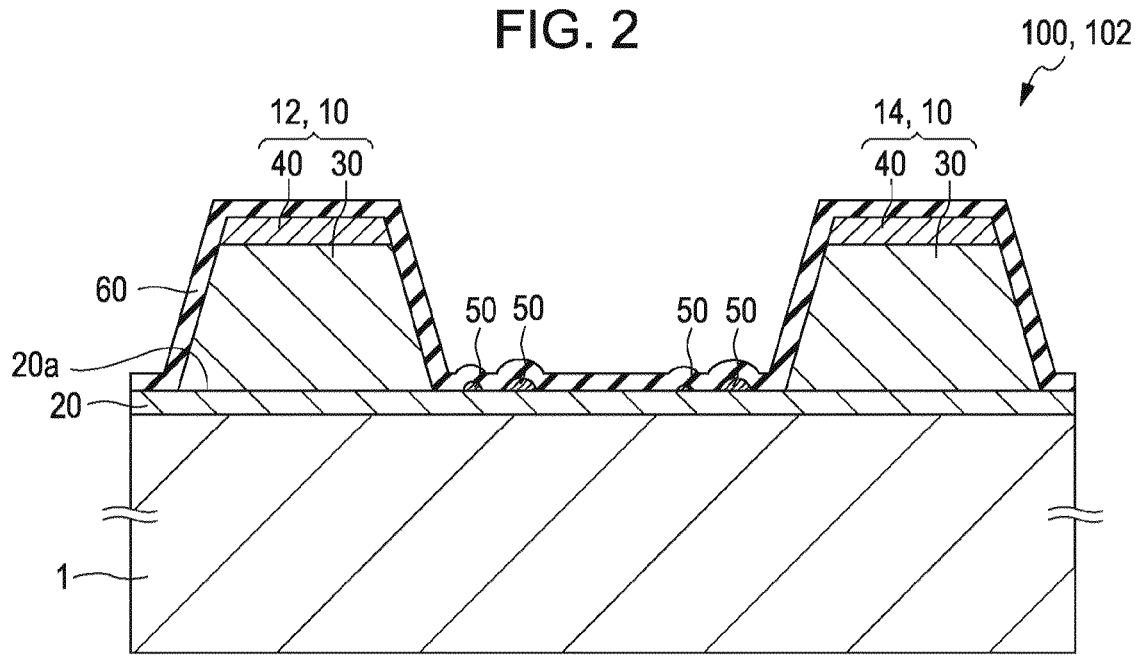
FIG. 2 is a schematic sectional view of the piezoelectric element according to the embodiment of the invention.

A piezoelectric element according to an embodiment of the invention will now be described with reference to some of the drawings. FIG. 1 is a schematic plan view of a piezoelectric element 100 according to an embodiment of the invention. FIG. 2 is a schematic sectional view of the piezoelectric element 100. For the sake of convenience, the covering layer 60 is not shown in FIG. 1. FIG. 2 shows the section taken along line II-II shown in FIG. 1.

As shown in FIGS. 1 and 2, the piezoelectric element 100 includes a first electrode 20, multilayer composites 10 and a covering layer 60. Each multilayer composite 10 may include a piezoelectric layer 30 and a second electrode 40. The piezoelectric element 100 is formed on a substrate 1.

The substrate 1 is a flat plate made of, for example, a semiconductor or an insulating material. The substrate 1 may be composed of a single layer or a plurality of layers. The substrate 1 may have any internal structure and may be a hollow plate, as long as the upper surface is flat.

The substrate 1 may include a flexible vibration plate that can be deformed (bent) by the behavior of the piezoelectric layer 30. In this instance, the piezoelectric element 100 can act as a piezoelectric actuator 102. The substrate 1 may be used as part of the walls partitioning pressure chambers. In the use of the piezoelectric actuator 102 in a liquid ejecting head, the capacity of the pressure chambers can be varied by the bending of the substrate 1 (vibration plate). If the substrate 1 includes a vibration plate, the vibration plate can be made of an inorganic compound, such as zirconium oxide ($ZrO_2$), silicon nitride or silicon oxide, or an alloy, such as stainless steel. The vibration plate may be composed of a single layer or a plurality of layers made of different materials.

The substrate 1 need not include the vibration plate, and, instead, the first electrode 20 may act as the vibration plate. In other words, the first electrode 20 may function as one of the electrodes for applying a voltage to the piezoelectric layer 30 and function as a vibration plate that can be deformed by the behavior of the piezoelectric layer 30. In this case as well, the piezoelectric element 100 can act as a piezoelectric actuator 102.

The first electrode 20 is formed on the substrate 1. The first electrode 20 and the substrate 1 may be separated by an additional layer (not shown), such as a layer enhancing the adhesion between the first electrode 20 and the substrate 1 or a layer enhancing strength or imparting conductivity.

The first electrode 20 may be in the form of a layer or a thin film. The first electrode 20 has a thickness, for example, in the range of 50 to 300 nm. The shape of the first electrode 20 is not particularly limited as long as the piezoelectric layer 30 can be disposed between the first electrode 20 and the opposing second electrode 40. The first electrode 20 may have a smooth surface 20a. The piezoelectric layer 30 does not cover the surface 20a of the first electrode 20 between the multilayer composites (for example, between the first multilayer composite 12 and the second multilayer composite 14).

The first electrode 20 contains a metal that can react with chlorine. More specifically, the first electrode 20 has a single-layer structure including a layer containing lanthanum and nickel, or a multilayer structure (not shown) including a layer containing platinum or iridium and a layer containing lanthanum and nickel that have been formed in that order. The layer containing lanthanum and nickel may be a lanthanum-nickel complex oxide ($LaNiO_x$, abbreviated as LNO) layer. The main constituent of the first electrode 20 may be a metal that can react with chlorine. The first electrode 20 may further contain another element.

Bumps 50 are formed on the surface 20a of the first electrode 20 between the multilayer composites 10 (for example, between the first multilayer composite 12 and the second multilayer composite). The bumps 50 are raised portions above the surface 20a of the first electrode 20. The shape of the bumps 50 is not particularly limited, and may be hemispherical. A plurality of bumps 50 are formed as shown in FIGS. 1 and 2. The shapes of the bumps 50 may be the same or different. As shown in FIG. 1, the number of the bumps 50 per unit area increases toward the multilayer composites 10. In other words, the number of the bumps 50 per unit area increases in the direction from the center line 22 between the first multilayer composite 12 and the second multilayer composite 14 (the position on the surface 20a of the first electrode 20 with the same distance from the first multilayer composite 12 and from the second multilayer composite 14) to the first multilayer composite 12, and also in the direction from the center line 22 to the second multilayer composite 14. Hence, the number of the bumps 50 per unit area around the multilayer composites 10 is larger than that around the center lines 22.

Figure 3:
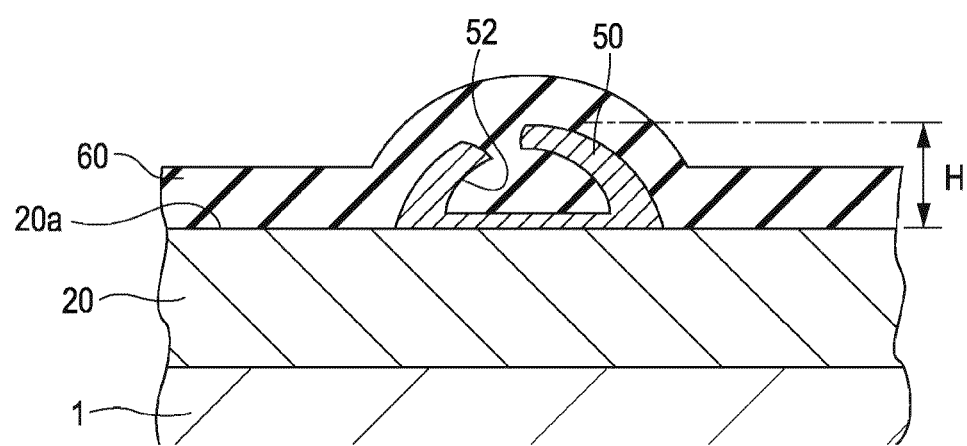
FIG. 3 is a schematic sectional view of a bump of the piezoelectric element according to the embodiment of the invention.

FIG. 3 is a sectional view of one of the bumps 50. The bump 50 may have a cavity 52, as shown in FIG. 3. The cavity 52 communicates with the outside, and part of the covering layer 60 is present in the cavity 52. In FIG. 3, the cavity 52 is filled with a portion of the covering layer 60. The height H of the bumps 50 (distance from the surface 20a of the first electrode 20 to the top of the bump 50) may be in the range of 50 to 300 nm. The bumps 50 have widths in the range of 20 to 1500 nm.

Such bumps can enhance the adhesion between the covering layer 60 and the first electrode 20. The bumps 50 may contain lanthanum, nickel and chlorine. For example, the bumps 50 are made of a chloride of LNO.

One of the functions of the first electrode 20 is to form a pair with the second electrode 40 so as to act as one of the electrodes (for example, a lower electrode disposed under the piezoelectric layer 30) for applying a voltage to the piezoelectric layer 30. The first electrode 20 may be a common electrode of the multilayer composites 10. More specifically, the first electrode 20 for applying a voltage to the first multilayer composite 12 may be electrically connected to the first electrode 20 for applying a voltage to the second multilayer composite 14. In the structure shown in FIG. 1, the first electrode 20 for applying a voltage to the first multilayer composite 12 and the first electrode 20 for applying a voltage to the second multilayer composite 14 are formed in an integrated manner as a common electrode.

The multilayer composites 10 are disposed on the first electrode 20. Although FIG. 1 shows three multilayer composites 10, the number of the multilayer composites 10 is not particularly limited. The multilayer composites 10 are separate from each other, and may be arranged in parallel in the direction of the width of the second electrode 40. Hence, in this instance, the width direction of the second electrode 40 is a direction in which the multilayer composites 10 are arranged in parallel with each other (arrangement direction). In the piezoelectric element 100, the width direction of the multilayer composite (the piezoelectric layer 30 and the second electrode 40) 10 is parallel to the arrangement direction, and the length of the multilayer composite 10 is perpendicular to the arrangement direction.

The piezoelectric layer 30 is formed on the first electrode 20. The piezoelectric layer 30 has a thickness, for example, in the range of 300 to 3000 nm.

The piezoelectric layer 30 is formed of a piezoelectric material. The piezoelectric layer 30 can be deformed by applying a voltage from the first electrode 20 and the second electrode 40. When the piezoelectric element 100 is configured to be a piezoelectric actuator 102, the vibration plate of the piezoelectric actuator 102 can be deformed (bent) by the deformation of the piezoelectric layer 30.

The piezoelectric layer 30 is preferably made of a perovskite-type oxide expressed by the general formula $ABO_3$ (for example, A may be Pb, and B may be Zr and Ti). Examples of such a perovskite-type oxide include lead zirconate titanate ($Pb(Zr,Ti)O_3$, abbreviated as PZT), lead zirconate titanate niobate ($Pb(Zr,Ti,Nb)O_3$), barium titanate ($BaTiO_3$), and potassium sodium niobate ($(K,Na)NbO_3$).

The second electrode 40 is formed over the piezoelectric layer 30. The second electrode 40 opposes the first electrode 20. The second electrode 40 may be in the form of a layer or a thin film. The second electrode 40 has a thickness, for example, in the range of 50 to 300 nm. The shape of the second electrode 40 is not particularly limited as long as the piezoelectric layer 30 can be disposed between the opposing first electrode 20 and the second electrode 40. In the embodiment shown in the drawings, the second electrode 40 is rectangular in plan view.

The second electrode 40 may be made of a metal, such as nickel, iridium or platinum, a conductive oxide of these metals, such as iridium oxide, a complex oxide of strontium and ruthenium ($SrRuO_x$, abbreviated as SRO), or a complex oxide of lanthanum and nickel ($LaNiO_x$, abbreviated as LNO). The second electrode 40 may be composed of a single layer made of any of the above materials, or a plurality of layers made of some of the above materials.

One of the functions of the second electrode 40 is to form a pair with the first electrode 20 so as to act as one of the electrodes (for example, an upper electrode disposed over the piezoelectric layer 30) for applying a voltage to the piezoelectric layer 30. The second electrode 40 may be a discrete electrode provided for each multilayer composite 10. More specifically, the second electrode 40 of the first multilayer composite 12 is electrically independent from the second electrode 40 of the second multilayer composite 14. The second electrode 40 may be electrically connected to a piezoelectric element driving circuit (not shown) through a wiring cable 42.

The covering layer 60 covers at least the side surfaces of the multilayer composites 10 and the surface 20a of the first electrode 20 between the multilayer composites 10 (for example, between the first multilayer composite 12 and the second multilayer composite 14). The covering layer 60 covers the bumps 50 on the surface 20a of the first electrode 20. In the embodiment shown in the drawings, the covering layer 60 also covers the upper surfaces of the multilayer composites 10. One of the functions of the covering layer 60 is to alleviate or prevent the degradation of the piezoelectric layer 30 resulting from the absorption of moisture from the atmosphere. In other words, the covering layer 60 can protect the piezoelectric layers 30 from moisture or the like.

The covering layer 60 can be made of silicon oxide ($SiO_2$), aluminum oxide ($Al_2O_3$), or a known organic material. Examples of the known organic material include photoresists and resin compositions containing polyimide, benzocyclobutene (BCB) or polyvinyl alcohol derivatives.

The piezoelectric element 100 may have the following features.

The piezoelectric element 100 has bumps 50 on the surface 20a of the first electrode 20 between the multilayer composites 10. Consequently, the contact area of the first electrode 20 with the covering layer 60 is increased relative to the case where the bumps 50 are not formed. Accordingly, the adhesion between the covering layer 60 and the first electrode 20 is increased to ensure high reliability.

The first electrode 20 of the piezoelectric element 100 has a single-layer structure including a layer containing lanthanum and nickel, or a multilayer structure including in this order from below a layer containing platinum or iridium and a layer containing lanthanum and nickel. Hence, the first electrode 20 contains a substance that can react with chlorine. Accordingly, the bumps 50 can be easily formed by dry etching using a chlorine-based gas. This makes the manufacturing process simple.

In the piezoelectric element 100, a plurality of bumps 50 are formed, and the number of the bumps 50 per unit area increases toward the multilayer composites 10. Thus, the adhesion between the covering layer 60 and the first electrode 20 around the multilayer composites 10 can be enhanced.

In the piezoelectric element 100, the bump 50 has a cavity 52 and a part of the covering layer 60 is present in the cavity 52. Thus, the adhesion between the covering layer 60 and the first electrode 20 can be further enhanced.

2. Method for Manufacturing the Piezoelectric Element

A method for manufacturing the piezoelectric element of the present embodiment will now be described with reference to some of the drawings. FIGS. 4 to 7 are schematic sectional views showing a method of manufacturing the piezoelectric element 100 of the present embodiment.

Figure 4:
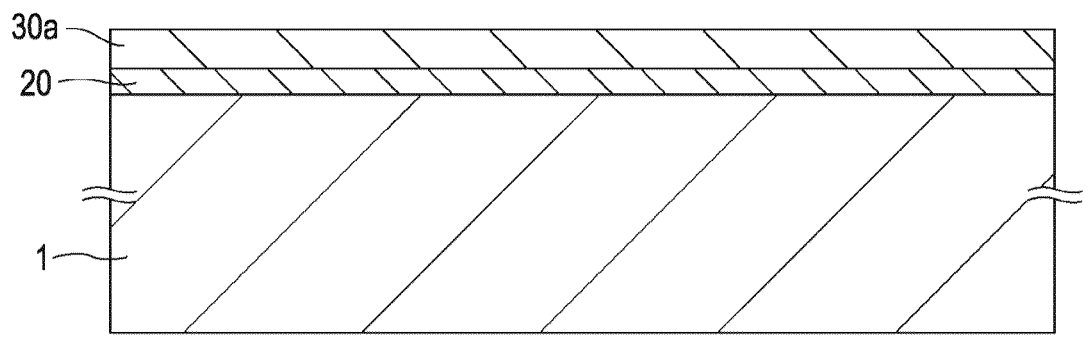
FIG. 4 is a schematic sectional view showing a method for manufacturing a piezoelectric element according to an embodiment of the invention.

As shown in FIG. 4, the first electrode 20 is formed on the substrate 1. The first electrode 20 can be formed by, for example, depositing a layer by sputtering, plating, vacuum vapor deposition, or the like, and patterning the layer. The patterning is performed by, for example, photolithography and etching.

Subsequently, a first piezoelectric material layer 30a is formed on the first electrode 20. The first piezoelectric material layer 30a can be formed by, for example, a sol-gel method, chemical vapor deposition CVD), metal organic deposition (MOD), sputtering, or laser ablation. The first piezoelectric material layer 30a may be heat-treated to be crystallized.

Figure 5:
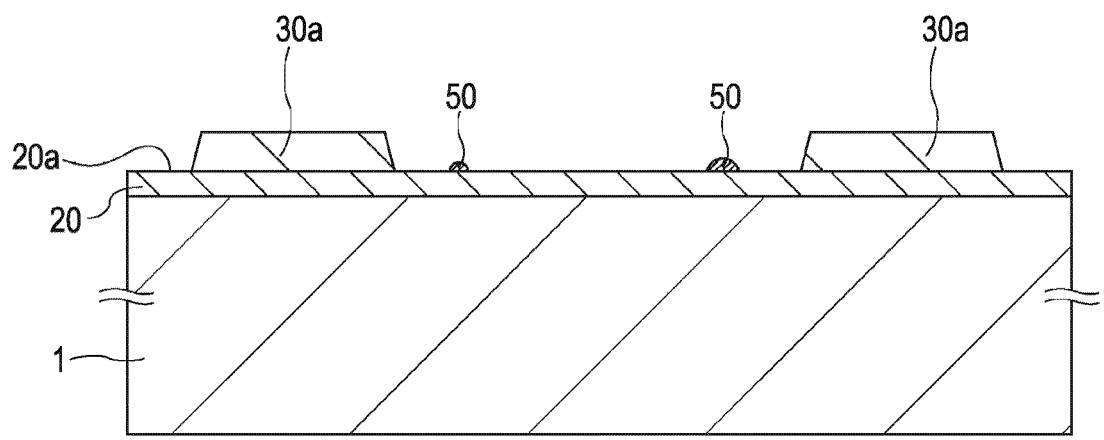
FIG. 5 is a schematic sectional view showing the method for manufacturing the piezoelectric element according to the embodiment of the invention.

As shown in FIG. 5, the first piezoelectric material layer 30a is patterned by, for example, a known dry etching process. The known dry etching process may be performed by using a high-density plasma apparatus, such as an ICP (Inductively Coupled Plasma) apparatus. For this dry etching, a mixed gas mainly containing a chlorine-based gas can be used as an etching gas. For example, a mixed gas containing $BCl_3$, $CF_4$ and Ar, or containing $Cl_2$ and Ar may be used. The etching in a high-density plasma apparatus can be advantageously performed under a pressure of 1.0 Pa or less.

In this operation, a reaction product is produced on the surface 20a of the first electrode 20 by a reaction between a constituent (for example, LNO) of the first electrode 20 and chlorine, thereby forming the bumps 50. Also, a larger amount of reaction product is produced around the resist (not shown) used for the patterning; hence, a larger number of the bumps 50 are formed around the patterned first piezoelectric material layer 30a.

Subsequently, a Ti layer (not shown) is formed over the first piezoelectric material layer 30a and the first electrode 20 by, for example, sputtering. The Ti layer can control the crystal growth of the below-described second piezoelectric material layer 30b. Consequently, highly oriented piezoelectric layers 30 can be formed.

Figure 6:
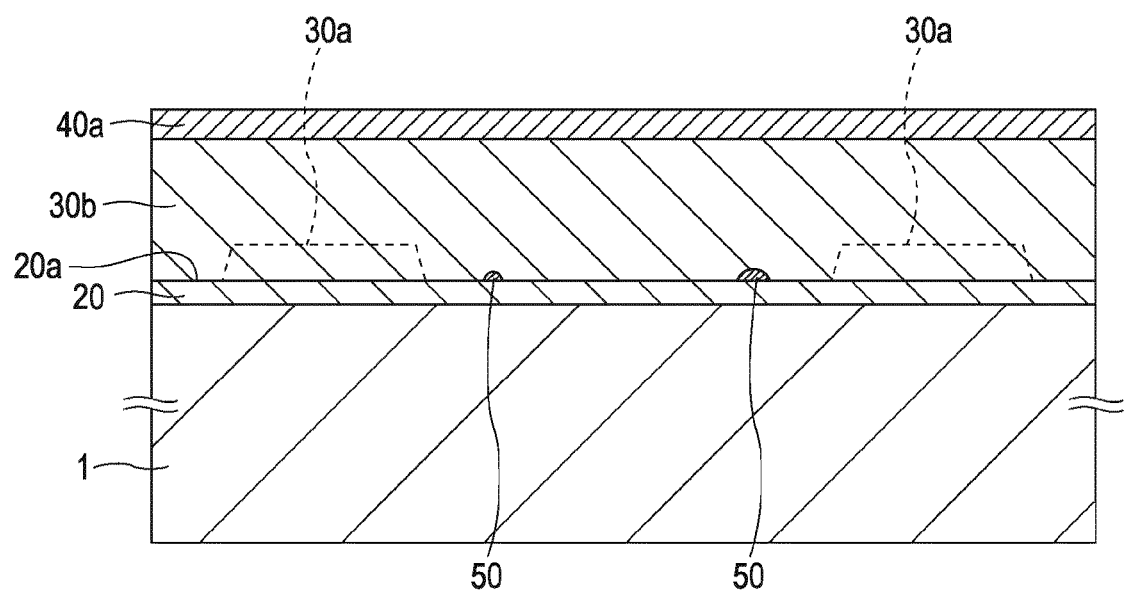
FIG. 6 is a schematic sectional view showing the method for manufacturing the piezoelectric element according to the embodiment of the invention.

As shown in FIG. 6, the second piezoelectric material layer 30b is formed over the first electrode 20, the first piezoelectric material layer 30a, and the bumps 50 with the Ti layer therebetween. The second piezoelectric material layer 30b is formed in the same manner as the first piezoelectric material layer 30a. The second piezoelectric material layer 30b may be heat-treated to be crystallized. The Ti layer is taken up by the second piezoelectric material layer 30b by the heat treatment.

Subsequently, a conductive material layer 40a is formed over the second piezoelectric material layer 30b. The conductive material layer 40a can be formed by sputtering, plating or vacuum vapor deposition.

Figure 7:
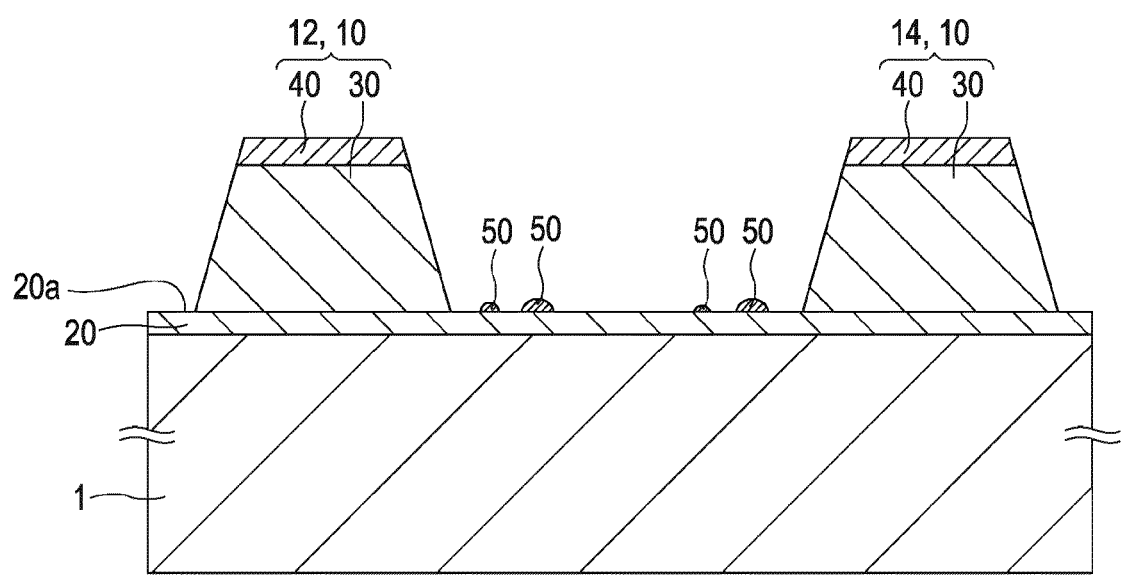
FIG. 7 is a schematic sectional view showing the method for manufacturing the piezoelectric element according to the embodiment of the invention.

As shown in FIG. 7, the conductive material layer 40a and the second piezoelectric material layer 30b are patterned into the second electrodes 40 and the piezoelectric layers 30, respectively. The patterning is performed, for example, in the same manner as the patterning of the first piezoelectric material layer 30a. Hence, bumps 50 are formed on the surface 20a of the first electrode 20 by the use of a chlorine-based gas as well in this patterning. Also, a larger amount of reaction product is produced around the resist (not shown) used for the patterning; hence, a larger number of the bumps 50 are formed around the piezoelectric layers 30.

Although the bumps 50 are formed by both the operations for patterning the first piezoelectric material layer 30a and the second piezoelectric material layer 30b in the present embodiment, the bumps 50 may be formed by only the operation for patterning the first piezoelectric material layer 30a, or by the operation for patterning the second piezoelectric material layer 30b.

Wiring cables 42 each electrically connected to the corresponding second electrode 42 are formed as shown in FIG. 1. The wiring cables 42 can be formed by, for example, depositing a layer by sputtering, plating, vacuum vapor deposition, or the like, and patterning the layer. The patterning is performed by, for example, photolithography and etching.

As shown in FIG. 2, the covering layer 60 is formed so as to cover at least the side surfaces of the multilayer composites 10 and the surface 20a of the first electrode 20 between the multilayer composites 10. The covering layer 60 can be formed by, for example, forming a layer by spin coating, sputtering, or the like, and patterning the layer. The patterning is performed by, for example, photolithography and etching.

Through the above operations, the piezoelectric element 100 can be manufactured.

The resulting piezoelectric element 100 can exhibit high reliability.

3. Experimental Examples

Figure 8A:
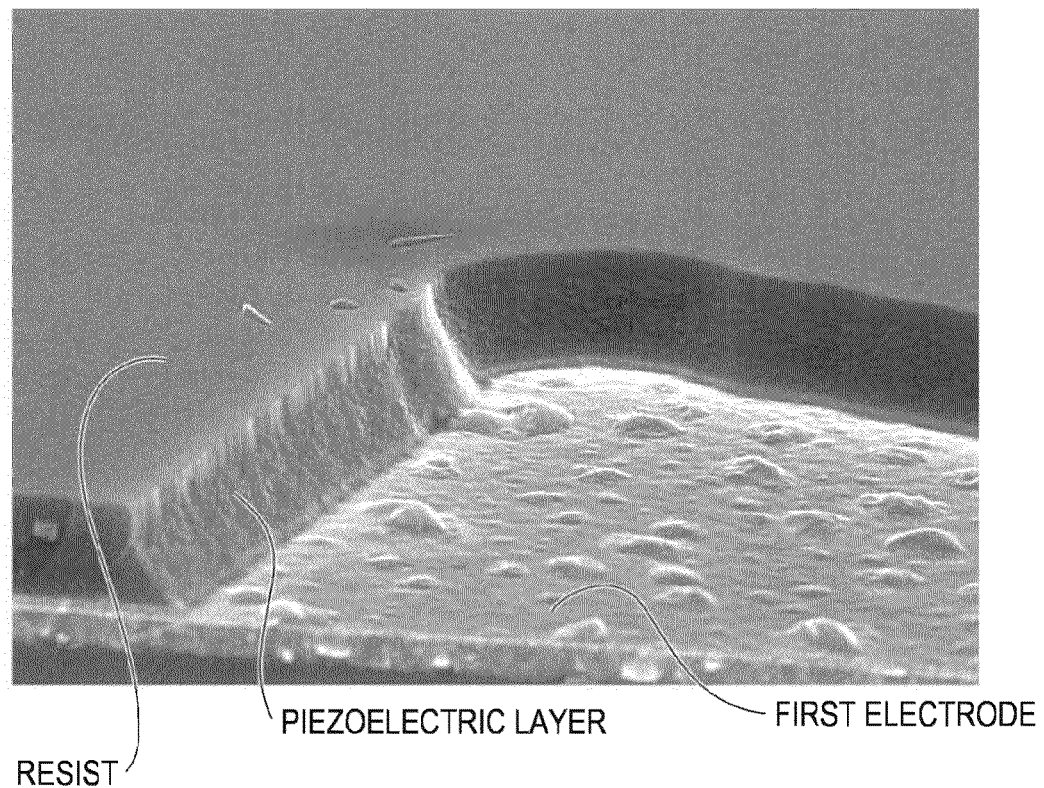
FIG. 8 is a scanning electron micrograph of a result of an experiment according to the embodiment of the invention.
Figure 8B:
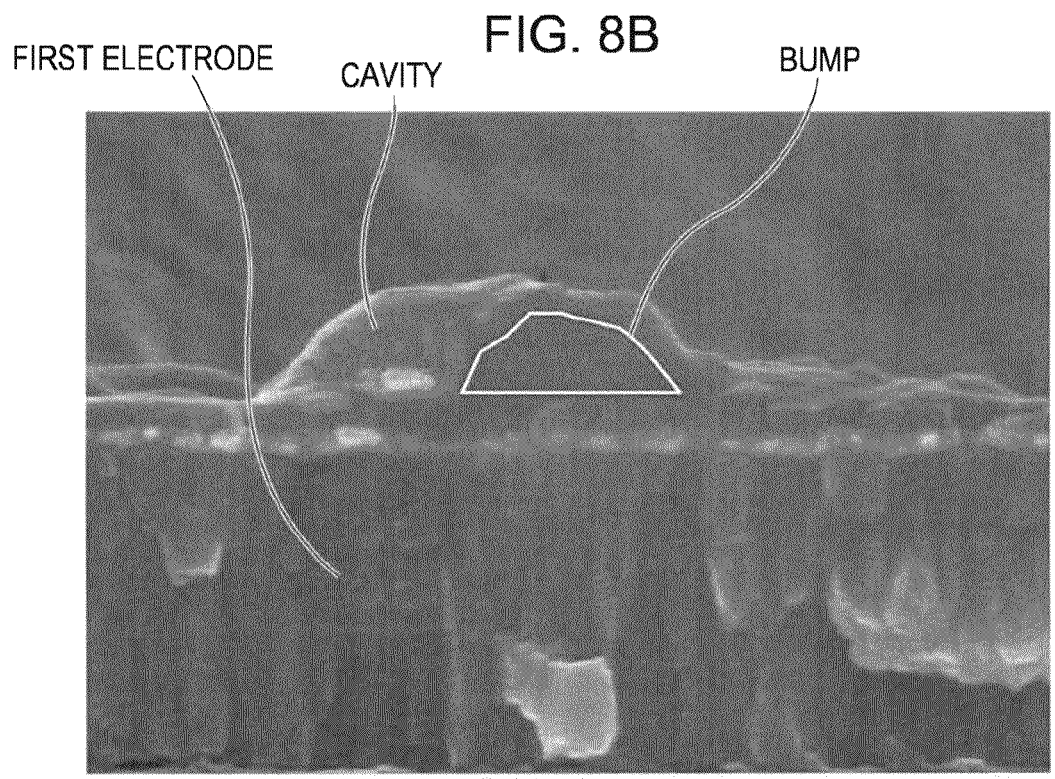

The invention will be further described in detail with reference to Experimental Examples below. However, the invention is not limited to the following Experimental Examples.
(1) Preparation of Samples First, silicon oxide ($SiO_2$) and zirconium oxide ($ZrO_2$) were deposited on a silicon substrate in that order by sputtering. Then, LNO was deposited to form a first electrode on the substrate. Subsequently, a PZT layer was formed by MOD and patterned into a first piezoelectric material layer in a high-density plasma apparatus (dry etching apparatus). In this operation, a mixed gas mainly containing chlorine-based gas was used as an etching gas, such as a gas containing $BCl_3$, $CF_4$ and Ar, or a gas containing $Cl_2$ and Ar. The pressure was set at 1.0 Pa or less. Subsequently, a Ti layer was formed by sputtering, and then a PZT layer (second piezoelectric material layer) was formed by MOD. Subsequently, the PZT layer was patterned to form piezoelectric layers in a high-density plasma apparatus (dry etching apparatus). In this operation, a mixed gas mainly containing a chlorine-based gas ($BCl_3$) was used as an etching gas. The pressure was set at 1.0 Pa or less.
(2) SEM Observation FIGS. 8A and 8B show the results of SEM observation of a sample prepared above. These results show that bumps were formed on the surface of the first electrode. In addition, FIG. 8B shows that the bumps have cavities.

4. Modification of Piezoelectric Element

Figure 9:
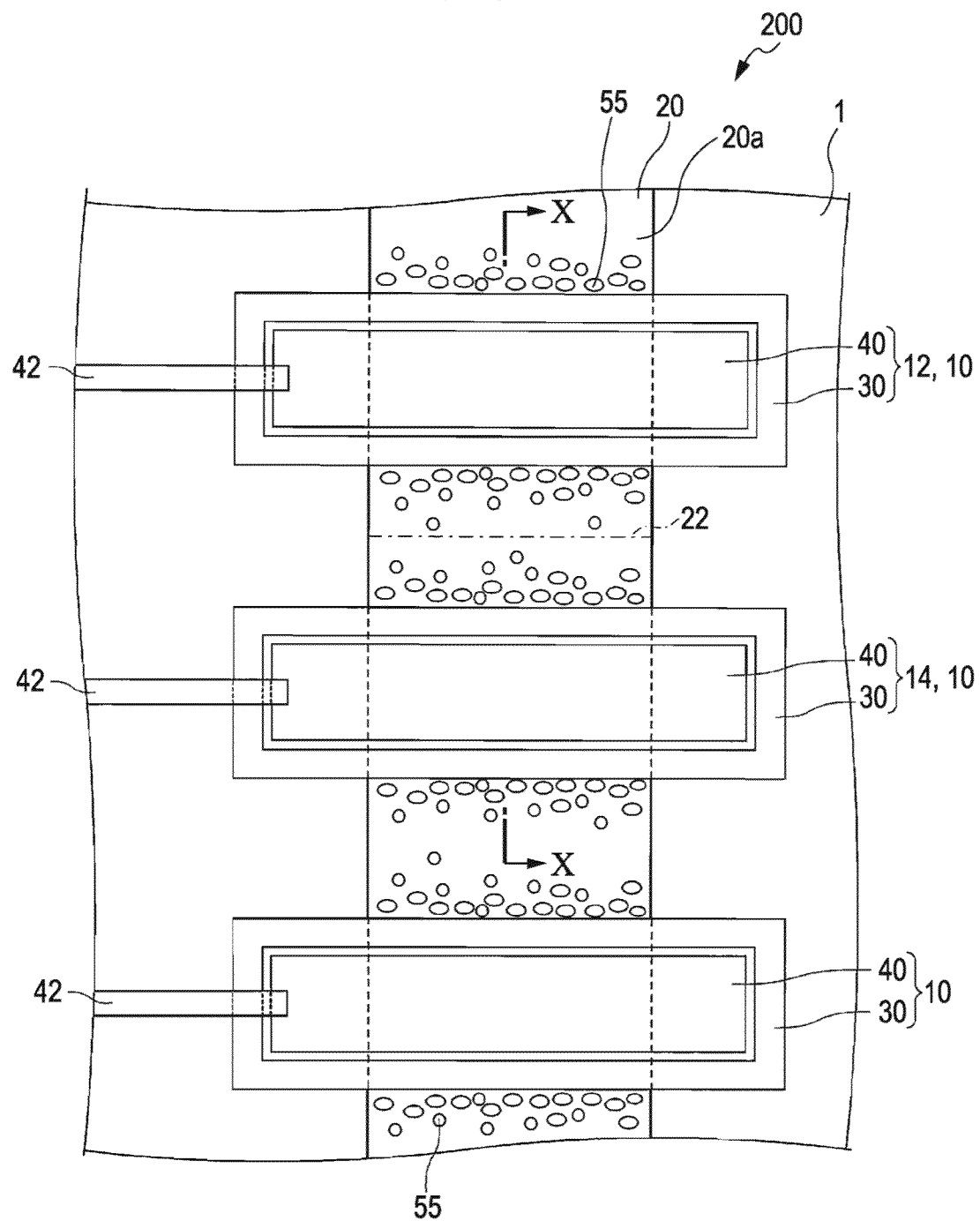
FIG. 9 is a schematic plan view of a piezoelectric element according to a modification of the embodiment of the invention.
Figure 10:
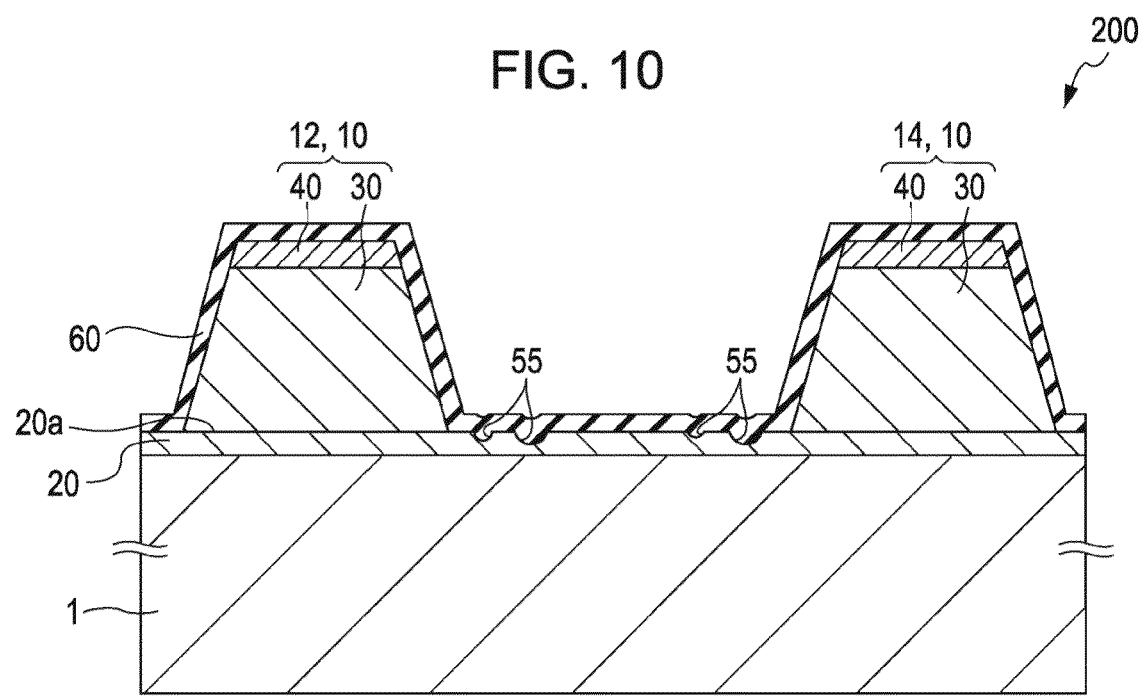
FIG. 10 is a schematic sectional view of the piezoelectric element according to the modification of the embodiment.

A piezoelectric element according to a modification of the above-described embodiment will now be described with reference to some of the drawings. FIG. 9 is a schematic plan view of a piezoelectric element 200 according to the modification. FIG. 10 is a schematic sectional view of the piezoelectric element 200. For the sake of convenience, the covering layer 60 is not shown in FIG. 9. FIG. 10 shows the section taken along line X-X shown in FIG. 9. The same parts of the piezoelectric element 200 as in the piezoelectric element 100 are designated by the same reference numerals, and description thereof is omitted.

The piezoelectric element 200 has dips 55 in the surface 20a of the first electrode 20 between the multilayer composites 10, as shown in FIGS. 9 and 10.

Dips 55 are portions of the surface 20a of the first electrode 20 that are lower than the other portions. A plurality of dips 55 are formed. The shape of the dips 55 is not particularly limited, and may be hemispherical. The shapes of the dips 55 may be the same or different. As shown in FIG. 9, the number of the dips 55 per unit area increases toward the multilayer composites 10. In other words, the number of the dips 55 per unit area increases in the direction from the center line 22 between the first multilayer composite 12 and the second multilayer composite 14 (the position on the surface 20a of the first electrode 20 with the same distance from the first multilayer composite 12 and from the second multilayer composite 14) to the first multilayer composite 12, and also in the direction from the center line 22 to the second multilayer composite 14. Hence, the number of the dips 55 per unit area around the multilayer composites 10 is larger than that around the center lines 22.

Figure 11:
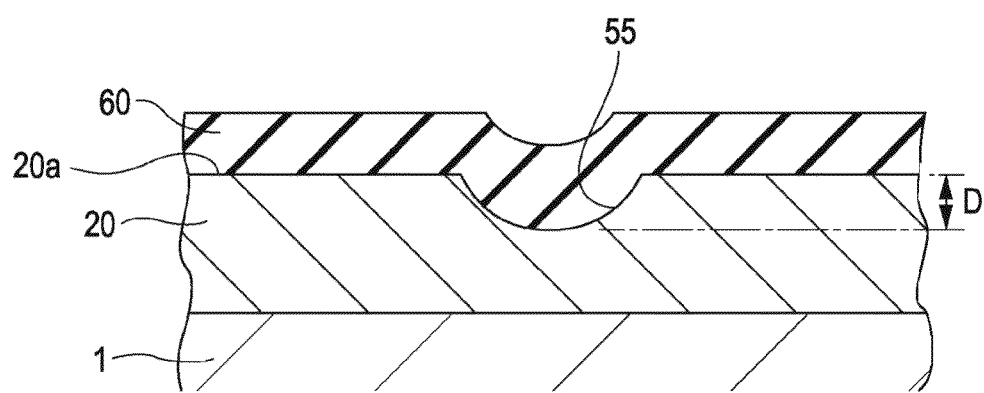
FIG. 11 is a schematic sectional view of a dip of the piezoelectric element according to the modification of the embodiment.

FIG. 11 is a sectional view of one of the dips 55. The covering layer 60 is formed along the surface of the dips 55. The depth D of the dip 55 (distance from the surface 20a of the first electrode 20 to the bottom of the dip 55) may be in the range of 10 to 100 nm. The dips 55 have widths in the range of 20 to 1500 nm. Such dips can enhance the adhesion between the covering layer 60 and the first electrode 20.

The piezoelectric element 200 has the following features.

The piezoelectric element 200 has dips 55 in the surface 20a of the first electrode 20 between the multilayer composites 10. Consequently, the contact area of the first electrode 20 with the covering layer 60 is increased relative to the case where the dips 55 are not formed. Accordingly, the adhesion between the covering layer 60 and the first electrode 20 is increased to ensure high reliability.

More specifically, the first electrode 20 has a single-layer structure including a layer containing lanthanum and nickel, or a multilayer structure including a layer containing platinum or iridium and a layer containing lanthanum and nickel that have been formed in that order. Therefore, since the first electrode 20 contains a substance that can react with chlorine, the dips 55 can be easily formed by dry etching using a chlorine-based gas, and thus the manufacturing process can be simplified.

In the piezoelectric element 200, a plurality of dips 55 are formed, and the number of the dips 55 per unit area increases toward the multilayer composites 10. Thus, the adhesion between the covering layer 60 and the first electrode 20 around the multilayer composites 10 can be enhanced.

5. Method for Manufacturing Piezoelectric Element of Modification

Figure 12:
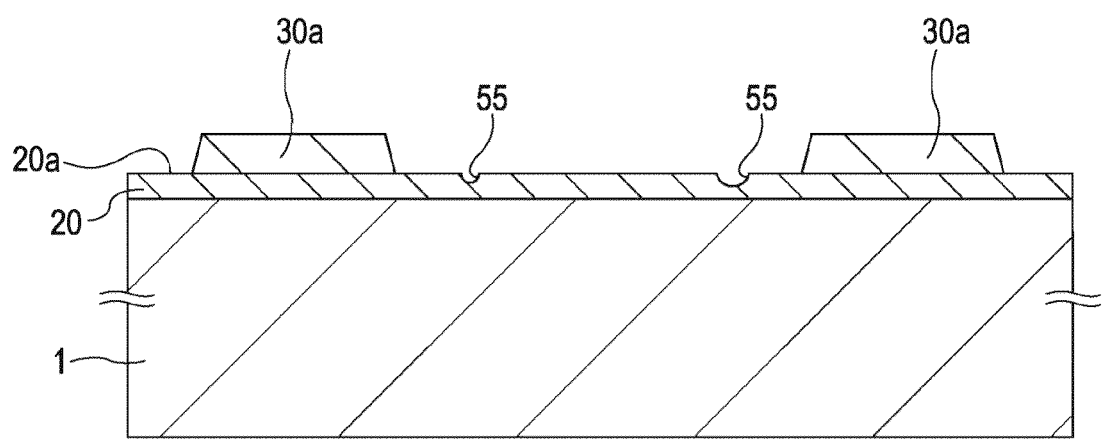
FIG. 12 is a schematic sectional view showing a method for manufacturing the piezoelectric element according to the modification of the embodiment.
Figure 13:
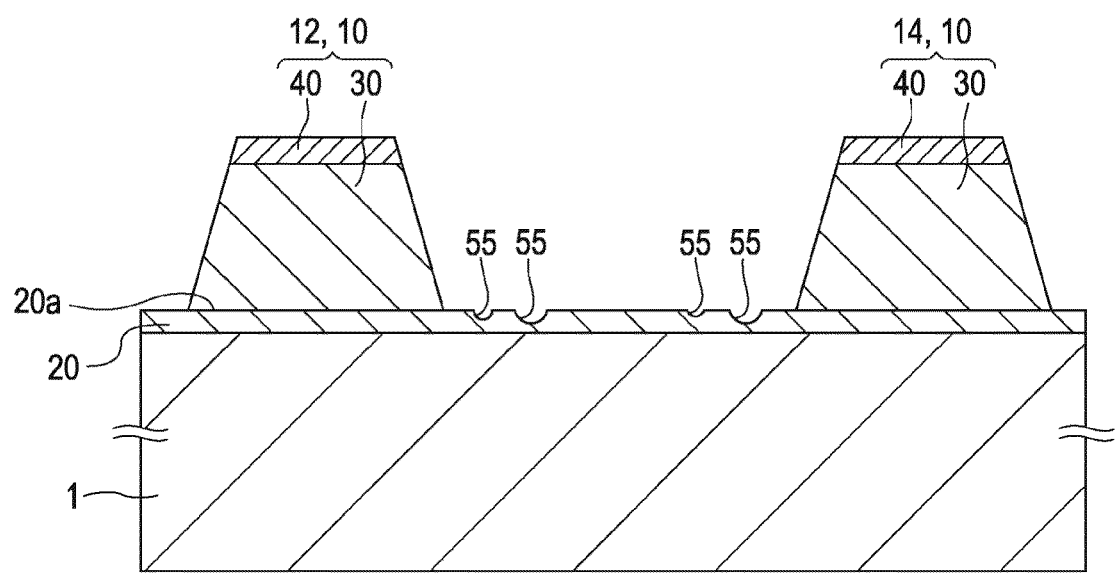
FIG. 13 is a schematic sectional view showing the method for manufacturing the piezoelectric element according to the modification of the embodiment.

A method for manufacturing the piezoelectric element of the modification of the present embodiment will now be described with reference to drawings. FIGS. 12 and 13 are schematic sectional views showing the manufacturing method of the piezoelectric element 200 of the modification. The following description will describe differences from the foregoing piezoelectric element 100, and similarities will be omitted.

First, the first electrode 20 is formed on the substrate 1. Subsequently, a first piezoelectric material layer 30a is formed on the first electrode 20 by deposition and patterning. The patterning is performed by dry etching. For the dry etching, a mixed gas mainly containing a chlorine-based gas can be used. For example, a mixed gas containing $BCl_3$, $CF_4$ and Ar, or containing $Cl_2$ and Ar may be used. Thus, bumps 50 are formed on the surface 20a of the first electrode 20. The first piezoelectric material layer 30a may be heat-treated to be crystallized after being deposited.

The surface 20a of the first electrode 20 is washed into a state as shown in FIG. 12. For the washing, pure water may be used. Since the bumps 50 are made of a chloride, they are soluble in water. Therefore, the bumps 50 are removed to form dips 55 there by washing. Since a larger number of bumps 50 have been formed around the patterned first piezoelectric material layer 30a, a larger number of dips 55 are formed around the patterned first piezoelectric material layer 30a.

Subsequently, a Ti layer (not shown) is formed over the first piezoelectric material layer 30a and the first electrode 20. Then, a second piezoelectric material layer 30b is formed over the first electrode 20 and the first piezoelectric material layer 30a with the Ti layer therebetween. The second piezoelectric material layer 30b may be heat-treated to be crystallized. Subsequently, the conductive material layer 40a is formed over the second piezoelectric material layer 30b, and the conductive material layer 40a and the second piezoelectric material layer 30b are patterned into the second electrodes 40 and the piezoelectric layers 30, respectively. The patterning may be performed, for example, in the same manner as the patterning of the first piezoelectric material layer 30a, thereby forming bumps 50 on the surface 20a of the first electrode 20.

The surface 20a of the first electrode 20 is washed into a state as shown in FIG. 13. For the washing, pure water may be used. The bumps 50 are removed to form dips 55 there by washing. Since a larger number of bumps 50 have been formed around the piezoelectric layers 30, a larger number of dips 55 are formed around the piezoelectric layers 30.

Although the dips 55 are formed by both the washing operations after patterning the first piezoelectric material layer 30a and after the second piezoelectric material layer 30b in the present embodiment, the dips 55 may be formed by either the washing operation after patterning the first piezoelectric material layer 30a or the washing operation after patterning the second piezoelectric material layer 30b.

As shown in FIG. 10, the covering layer 60 is formed so as to cover at least the side surfaces of the multilayer composites 10 and the surface 20a of the first electrode 20 between the multilayer composites 10.

Through the above operations, the piezoelectric element 200 can be manufactured.

The resulting piezoelectric element 200 can exhibit high reliability.

6. Liquid Ejecting Head

Figure 14:
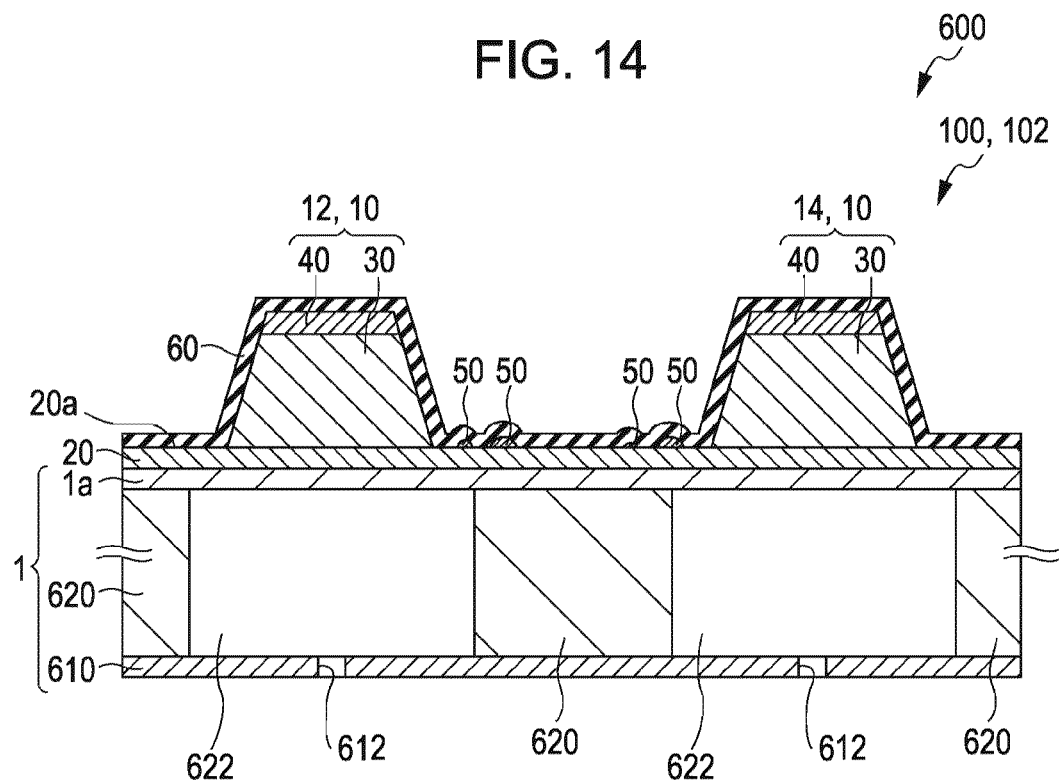
FIG. 14 is a schematic sectional view of a liquid ejecting head according to an embodiment of the invention.
Figure 15:
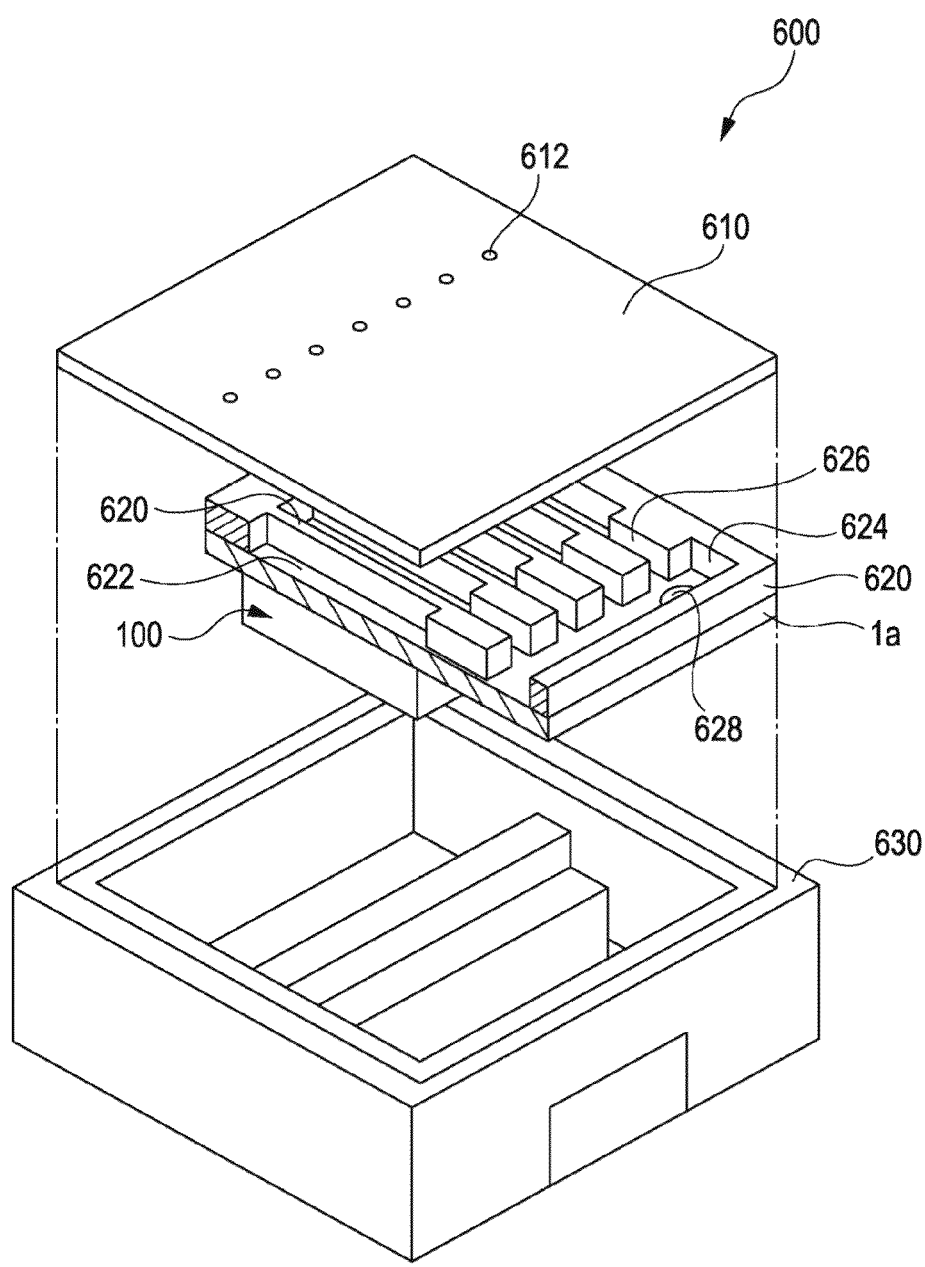
FIG. 15 is an exploded perspective view of the liquid ejecting head according to the embodiment.

A liquid ejecting head 600 will now be described as one of the applications of the piezoelectric element (piezoelectric actuator) of the present embodiment, with reference to drawings. FIG. 14 is a schematic sectional view showing major parts of a liquid ejecting head 600. FIG. 15 is an exploded perspective view of the liquid ejecting head 600, showing a state where the head is reversed from the normal position.

The liquid ejecting head 600 may include the piezoelectric element (piezoelectric actuator). In the liquid ejecting head 600 described below, a piezoelectric element 100 is disposed on a substrate 1 (structure including a vibration plate 1a at the upper side thereof). The piezoelectric element 100 and the vibration plate 1a define a piezoelectric actuator 102. The structure shown in FIGS. 14 and 15, the substrate 1 includes the vibration plate 1a, a pressure chamber substrate 620, and a nozzle plate 610.

The liquid ejecting head 600 includes the nozzle plate 610 having nozzle apertures 612, the pressure chamber substrate 620 having pressure chambers 622 therein, and the piezoelectric actuator 102, as shown in FIGS. 14 and 15. In addition, the liquid ejecting head 600 may include an enclosure 630, as shown in FIG. 15. FIG. 15 simply shows the piezoelectric element 100.

The nozzle plate 610 has nozzle apertures 612, as shown in FIGS. 14 and 15. Ink is ejected through the nozzle apertures 612. The nozzle apertures 612 may be aligned in a line in the nozzle plate 610. The nozzle plate 610 may be made of silicon or stainless steel (SUS).

The pressure chamber substrate 620 is disposed on the nozzle plate 610 (under the nozzle plate in FIG. 15). The pressure chamber substrate 620 may be made of, for example, silicon. The pressure chamber substrate 620 divides the space between the nozzle plate 610 and the vibration plate 1a so as to form a reservoir (liquid storage portion) 624, delivering paths 626 communicating with the reservoir 624, and pressure chambers 622 communicating with the respective delivering paths 626, as shown in FIG. 15. In the present embodiment, the reservoir 624, the delivering paths 626 and the pressure chambers 622 are described separately. However, they function as liquid flow channels, and the flow channel can be arbitrarily designed without particular limitation. The delivering paths 626 shown in FIG. 15 are each partially narrowed, but can be formed in any shape according to the design without being limited to such a shape. The reservoir 624, the delivering paths 626 and the pressure chambers 622 are partitioned by the nozzle plate 610, the pressure chamber substrate 620 and the vibration plate 1a.

The reservoir 624 can temporally store ink supplied from the outside (for example, an ink cartridge) through a through hole 628 formed in the substrate 1. The ink in the reservoir 624 is delivered to the pressure chambers 622 through the delivering paths 626. The capacity of the pressure chamber 622 is varied by the deformation of the vibration plate 1a. The pressure chambers 622 communicate with the corresponding nozzle apertures 612. By varying the capacity of the pressure chamber 622, the ink is ejected through the nozzle aperture 612. The reservoir 624 may be called a manifold.

The piezoelectric element 100 is disposed over the pressure chamber substrate 620 (under the pressure chamber substrate in FIG. 15). The piezoelectric element 100 is electrically connected to a piezoelectric element driving circuit (not shown) so as to be operated (for vibration or deformation) according to the signal from the piezoelectric element driving circuit. The vibration plate 1a is deformed by the behavior of the piezoelectric layer 30 to vary the pressure in the pressure chamber 622 as required.

In the structure shown in FIG. 14, the width of the pressure chamber 622 along the width of the second electrode 40 is larger than the width of the piezoelectric layer 30 along the width of the second electrode 40. Hence, the side surfaces of the piezoelectric layer 30 are located to the inner side of the side surfaces of the pressure chamber 622 (defined by the pressure chamber substrate 620 partitioning the pressure chambers 622). Thus, the inner pressure in the pressure chamber 622 can be varied effectively.

The enclosure 630 accommodates the nozzle plate 610, the pressure chamber substrate 620 and the piezoelectric element 100, as shown in FIG. 15. The enclosure 630 can be made of, for example, a resin or a metal.

The liquid ejecting head 600 includes the above-described reliable piezoelectric element 100. Accordingly, the liquid ejecting head 600 can exhibit high reliability.

In the above description, an ink jet recording head have been illustrated as an embodiment of the liquid ejecting head 600. However, the liquid ejecting head may be used as a color material ejecting head used for manufacturing color filters of liquid crystal displays or the like, an electrode material ejecting head used for forming electrodes of organic EL displays or field emission displays (FEDs), or a bioorganic material ejecting head used for manufacturing bio-chips.

7. Liquid Ejecting Apparatus

Figure 16:
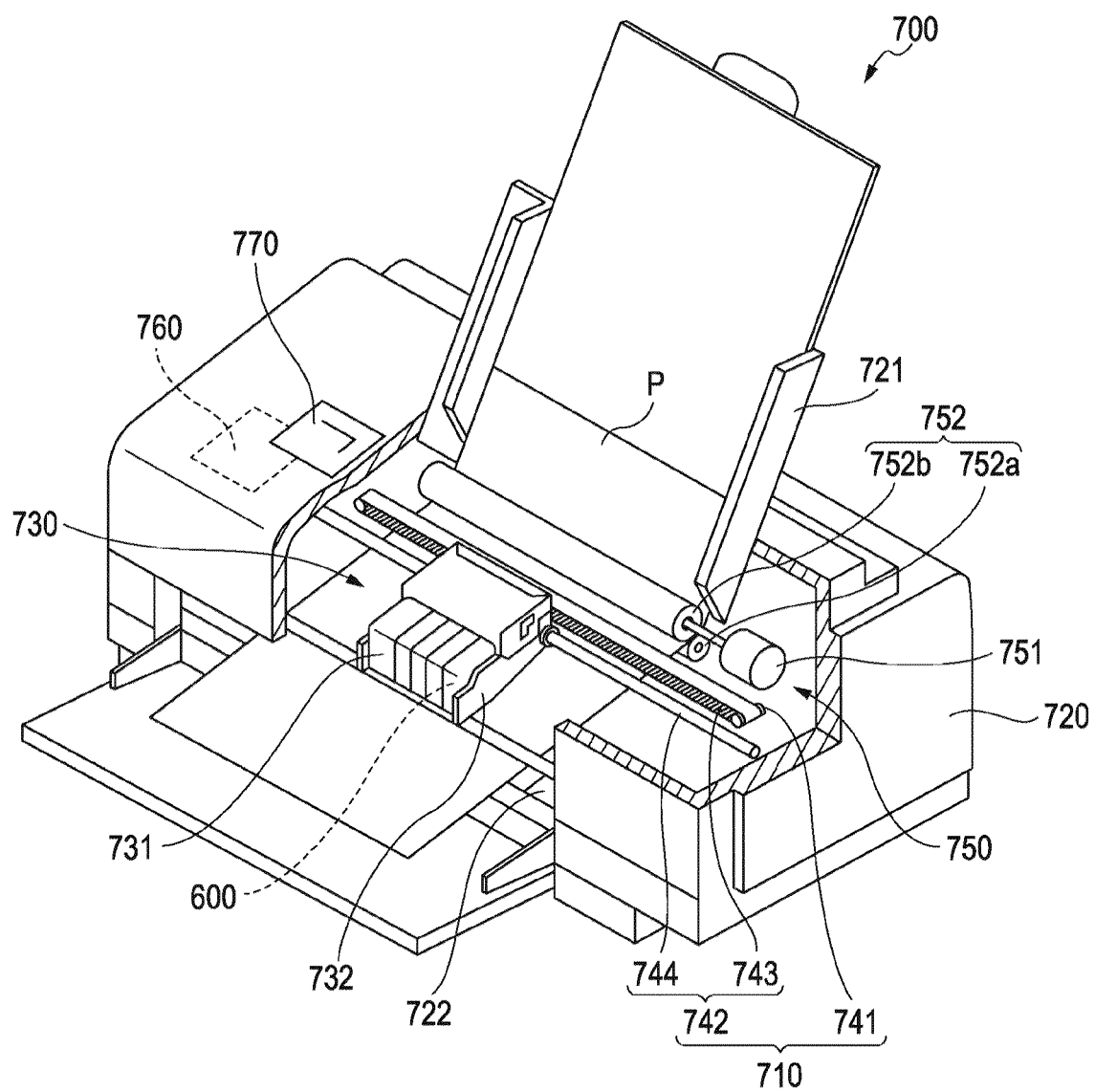
FIG. 16 is a schematic perspective view of a liquid ejecting apparatus according to an embodiment of the invention.

A liquid ejecting apparatus according to an embodiment of the invention will now be described with reference to a drawing. The liquid ejecting apparatus includes the above-described liquid ejecting head. In the following description, the liquid ejecting apparatus functions as an ink jet printer including the liquid ejecting head. FIG. 16 is a schematic perspective view of the liquid ejecting apparatus 700 of an embodiment of the invention.

The liquid ejecting apparatus 700 includes a head unit 730, a driving section 710, and a control section 760, as shown in FIG. 16. The liquid ejecting apparatus 700 may further include an apparatus body 720, a paper feeding section 750, a tray 721 on which recording paper P is placed, a paper ejecting port 722 from which the recording paper P is ejected, and a control panel 770 disposed on the upper surface of the apparatus body 720.

The head unit 730 includes an ink jet recording head (hereinafter may be simply referred to as the head) including the liquid ejecting head 600. The head unit 730 further includes an ink cartridge 731 from which an ink is delivered to the head, and a carrying portion (carriage) 732 on which the head and the ink cartridge 731 are disposed.

The driving section 710 reciprocally moves the head unit 730. The driving section 710 includes a carriage motor 741 acting as a driving source of the head unit 730, and a reciprocal movement mechanism 742 allowing the head unit 730 to be reciprocally moved by the rotation of the carriage motor 741.

The reciprocal movement mechanism 742 includes a carriage guide shaft 744 whose ends are held by a frame (not shown), and a timing belt 743 extending in parallel with the carriage guide shaft 744. The carriage guide shaft 744 supports the carriage 732 so as to allow the reciprocal movement of the carriage 732. The carriage 732 is secured to part of the timing belt 743. When the timing belt 743 is moved by the operation of the carriage motor 741, the head unit 730 reciprocally moves along the carriage guide shaft 744. The head ejects ink during the reciprocal movement to print on the recording paper P.

In the liquid ejecting apparatus of the present embodiment, printing is performed while both the liquid ejecting head 600 and the recording paper P are moving. However, only either the liquid ejecting head 600 or the recording paper P may move, as long as the liquid ejecting head 600 can perform recording on paper P while the positions of the head 600 and the recording paper P are relatively changed. In the present embodiment, printing is performed on the recording paper P. However, the recording medium on which the liquid ejecting apparatus prints is not limited to paper, and it can be appropriately selected from a wide range of media including cloth, plastic sheets, and metal sheets.

The control section 760 can control the head unit 730, the driving section 710 and the paper feeding section 750.

The paper feeding section 750 feeds recording paper P toward the head unit 730 from the tray 721. The paper feeding section 750 includes a paper feeding motor 751 acting as a driving source, and paper feeding rollers 752 rotated by the operation of the paper feeding motor 751. The paper feeding rollers 752 include a driven roller 752a and a driving roller 752b vertically opposing each other between which the recording paper P is fed. The driving roller 752b is coupled with the paper feeding motor 751. When the paper feeding section 750 is driven by the control section 760, the recording paper P is transported under the head unit 730.

The head unit 730, the driving section 710, the control section 760 and the paper feeding section 750 are disposed within the apparatus body 720.

The liquid ejecting apparatus 700 includes the reliable liquid ejecting head 600. Accordingly, the liquid ejecting apparatus 700 can exhibit high reliability.

Although the liquid ejecting apparatus 700 of the present embodiment includes a single liquid ejecting head 600 that can print on a recording medium, the liquid ejecting head 600 may include a plurality of liquid ejecting heads. If a plurality of liquid ejecting heads are used, they may be independently operated as described above, or may be connected to each other to define a single head combined. Such a combined head may be, for example, a line head in which heads are arranged in such a manner that the nozzle apertures of the heads are aligned at regular intervals.

In the above description, an ink jet printer has been described as an embodiment of the liquid ejecting apparatus 700 of the invention. The liquid ejecting apparatus can also be used in industrial fields. In this instance, the liquid ejected from the apparatus may be a functional material whose viscosity has been adjusted with a solvent or disperse medium. The liquid ejecting apparatus of the embodiments of the invention can be used as color material ejecting apparatuses used for manufacturing color filters of liquid crystal displays, liquid material ejecting apparatuses used for forming electrodes and color filters of organic EL displays, field emission displays (FEDs) and electrophoretic displays, and bioorganic material ejecting apparatuses used for manufacturing biochips, in addition to the above-described recording apparatus or printer.

The embodiments and the modification described above can be appropriately combined. A combined embodiment or modification can produce their effects and a synergistic effect.

While the invention has been described with reference to exemplary embodiments, it is to be understood that various modifications may be made without departing from the new features and effects of the invention. Such modifications are within the scope of the invention.

What is claimed is:

1. A piezoelectric element comprising:
   a first electrode containing a metal that can react with chlorine;
   a first multilayer composite disposed on the first electrode, the first multilayer composite including a piezoelectric layer and a second electrode over the piezoelectric layer;
   a second multilayer composite disposed on the first electrode at a distance from the first multilayer composite, the second multilayer composite including a piezoelectric layer and a second electrode over the piezoelectric layer; and
   a covering layer covering the side surfaces of the first and second multilayer composites and the surface of the first electrode between the first multilayer composite and the second multilayer composite,
   wherein the first electrode has at least one of a bump and a dip at the surface thereof between the first multilayer composite and the second multilayer composites;
   wherein the bump contains lanthanum, nickel and chlorine.

2. The piezoelectric element according to claim 1, wherein the first electrode has a single-layer structure including a layer containing lanthanum and nickel, or a multilayer structure including a layer containing platinum or iridium and a layer containing lanthanum and nickel that have been formed in that order.

3. The piezoelectric element according to claim 1, wherein a plurality of bumps are formed on the surface of the first electrode, and the number of the bumps per unit area gradually increases toward the first multilayer composite and the second multilayer composite.

4. The piezoelectric element according to claim 1, wherein the bump has a cavity, and part of the covering layer is present in the cavity.

5. The piezoelectric element according to claim 1, wherein a plurality of dips are formed in the surface of the first electrode, and the number of dips per unit area gradually increases toward the first multilayer composite and the second multilayer composite.

6. A piezoelectric actuator comprising the piezoelectric element as set forth in claim 1.

7. A piezoelectric actuator comprising the piezoelectric element as set forth in claim 2.

8. A piezoelectric actuator comprising the piezoelectric element as set forth in claim 3.

9. A piezoelectric actuator comprising the piezoelectric element as set forth in claim 4.

10. A piezoelectric actuator comprising the piezoelectric element as set forth in claim 5.

11. A piezoelectric actuator comprising the piezoelectric element as set forth in claim 1.

12. A liquid ejecting head comprising the piezoelectric actuator as set forth in claim 6.

13. A liquid ejecting head comprising the piezoelectric actuator as set forth in claim 7.

14. A liquid ejecting head comprising the piezoelectric actuator as set forth in claim 8.

15. A liquid ejecting head comprising the piezoelectric actuator as set forth in claim 9.

16. A liquid ejecting apparatus comprising the liquid ejecting head as set forth in claim 12.

17. A liquid ejecting apparatus comprising the liquid ejecting head as set forth in claim 13.

18. A liquid ejecting apparatus comprising the liquid ejecting head as set forth in claim 14.

19. A liquid ejecting apparatus comprising the liquid ejecting head as set forth in claim 15.

* * * * *